(12) United States Patent
Baker (10) Patent No.: US 6,930,942 B2
(45) Date of Patent: *Aug. 16, 2005

(54) METHOD AND APPARATUS FOR MEASURING CURRENT AS IN SENSING A MEMORY CELL

(75) Inventor: R. Jacob Baker, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/901,183

(22) Filed: Jul. 29, 2004

(65) Prior Publication Data

US 2005/0002249 A1 Jan. 6, 2005

Related U.S. Application Data

(63) Continuation of application No. 10/457,366, filed on Jun. 10, 2003, now Pat. No. 6,795,359.

(51) Int. Cl.[7] ................................................ G11C 7/02
(52) U.S. Cl. .................. 365/209; 365/189.09; 365/158
(58) Field of Search ........................... 365/209, 189.09, 365/158

(56) References Cited

U.S. PATENT DOCUMENTS

| 4,285,051 A | 8/1981 | Henneuse |
| 4,352,070 A | 9/1982 | Beauducel et al. |
| 5,457,035 A | 10/1995 | Baum et al. |
| 6,160,851 A | 12/2000 | Brown et al. |
| 6,462,981 B2 | 10/2002 | Numata et al. |
| 6,597,598 B1 | 7/2003 | Tran et al. |
| 6,795,359 B1 * | 9/2004 | Baker .......................... 365/209 |

FOREIGN PATENT DOCUMENTS

DE          37 39 208 A1      6/1989

* cited by examiner

*Primary Examiner*—David Nelms
*Assistant Examiner*—Tu-Tu Ho
(74) *Attorney, Agent, or Firm*—Dickstein Shapiro Morin & Oshinsky LLP (57) ABSTRACT

Apparatus and methods sense or measure an input current, such as a current indicating a logic state of a memory cell. A sensing circuit includes an amplifier, a capacitor, a current source circuit, a clocked comparator and a clocked counter. The current source circuit operates responsive to an output of the comparator to supply or withdraw current to and from the capacitor during respective charging and discharging intervals. The count in the clocked counter results from periodic comparisons of the capacitor voltage with a reference voltage and is, therefore, related to the logic state of the memory cell. The magnitude of current supplied during charging is less than the magnitude withdrawn during discharging, allowing use of a smaller counter.

30 Claims, 7 Drawing Sheets

METHOD AND APPARATUS FOR MEASURING CURRENT AS IN SENSING A MEMORY CELL

CROSS-REFERENCE TO RELATED APPLICATIONS

This application is a continuation of application Ser. No. 10/457,366, filed Jun. 10, 2003 (now U.S. Pat. No. 6,795,359), the subject matter of which is incorporated by reference herein.

FIELD OF THE INVENTION

The present invention relates to current measurement. For example, current may be measured to sense status of resistor-based memory devices such as magneto-resistive random access memory (MRAM) devices, which store logic values as resistive states of memory cells.

BACKGROUND OF THE INVENTION

Figure 1:
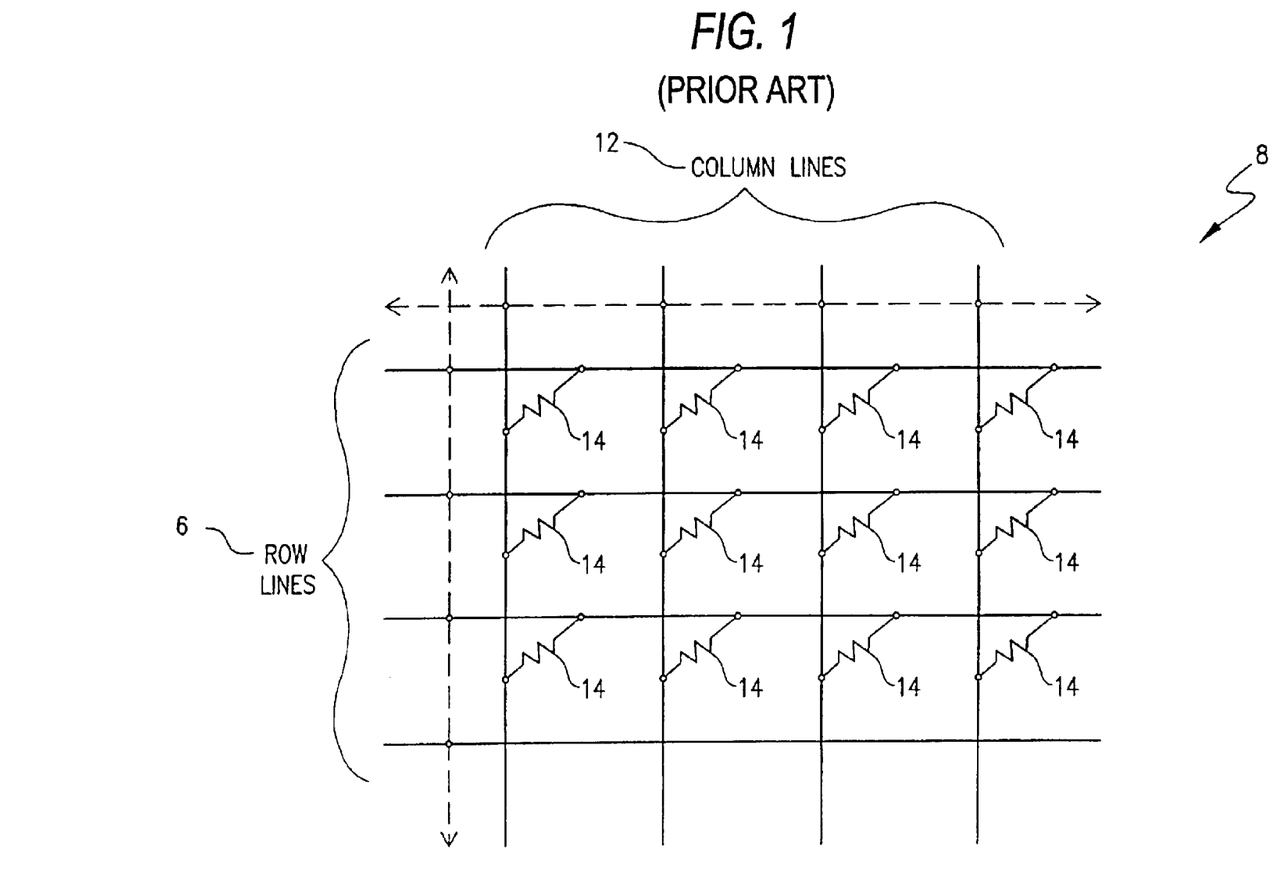
FIG. 1 shows a portion of a conventional MRAM device using a crosspoint architecture.

FIG. 1 shows one example of a resistor-based memory array architecture called a crosspoint array. The memory array 8 includes a plurality of row lines 6 arranged orthogonally to a plurality of column lines 12. Each row line is coupled to each of the column lines by a respective resistive memory cell 14. The resistance value of each memory cell stores one of two or more logical values depending on which of a plurality of resistance values it is programmed to exhibit. A characteristic of the crosspoint array having resistance cells 14 connected to row and column lines is that there are no memory cell access transistors in the array.

A MRAM device is one approach to implementing a resistance-based memory. In a MRAM each resistive memory cell typically includes a pinned magnetic layer, a sensed magnetic layer and a tunnel barrier layer between the pinned and sensed layers. The pinned layer has a fixed magnetic alignment, and a magnetic alignment of the sensed layer can be programmed to different orientations. The resistance of the cell varies, depending on the alignment of the sensed layer. One resistance value, e.g., a higher value, is used to signify a logic "one" while another resistance value, e.g., a lower value, is used to signify a logic "zero". The stored data is read by sensing respective resistance values of memory cells and interpreting the resistance values thus sensed as logic states of the stored data.

For binary logic state sensing, the absolute magnitude of memory cell resistance need not be known, only whether the resistance is above or below a threshold value that is intermediate to the logic one and logic zero resistance values. Nonetheless, sensing the logic state of a MRAM memory element is difficult because the technology of the MRAM device impose multiple constraints.

A MRAM cell resistance is sensed at the column line of the addressed cell. In order to sense the cell, a row line connected to that cell is typically grounded while the remaining row lines and column lines are held at a particular voltage. Reducing or eliminating transistors from a memory cell tends to reduce the cell area requirements, increasing storage density and reducing costs. A cell of a crosspoint array, as discussed above, includes no transistors. This is achieved by allowing each resistive element to remain electrically coupled to respective row and column lines at all times. As a result, when a memory cell is sensed, it is also shunted by a significant sneak current path through the other memory cells of the addressed row line.

In a conventional MRAM device, the high resistance state has a resistance of about 1MΩ. An element in a low resistance state has a resistance of about 950 KΩ. The differential resistance between a logic one and a logic zero is, thus, typically about 50KΩ or about 5% of scale. Accordingly, a sensing voltage across a sensed MRAM device varies by about 5% of scale between the logic one and logic zero states.

One approach to sensing MRAM resistance is to integrate a current corresponding to sensing voltage over time, and to sample the resulting integrand voltage. This can be done by applying a voltage to an input of a transductance amplifier, and accumulating a current output by the amplifier with a capacitor.

Figure 2:
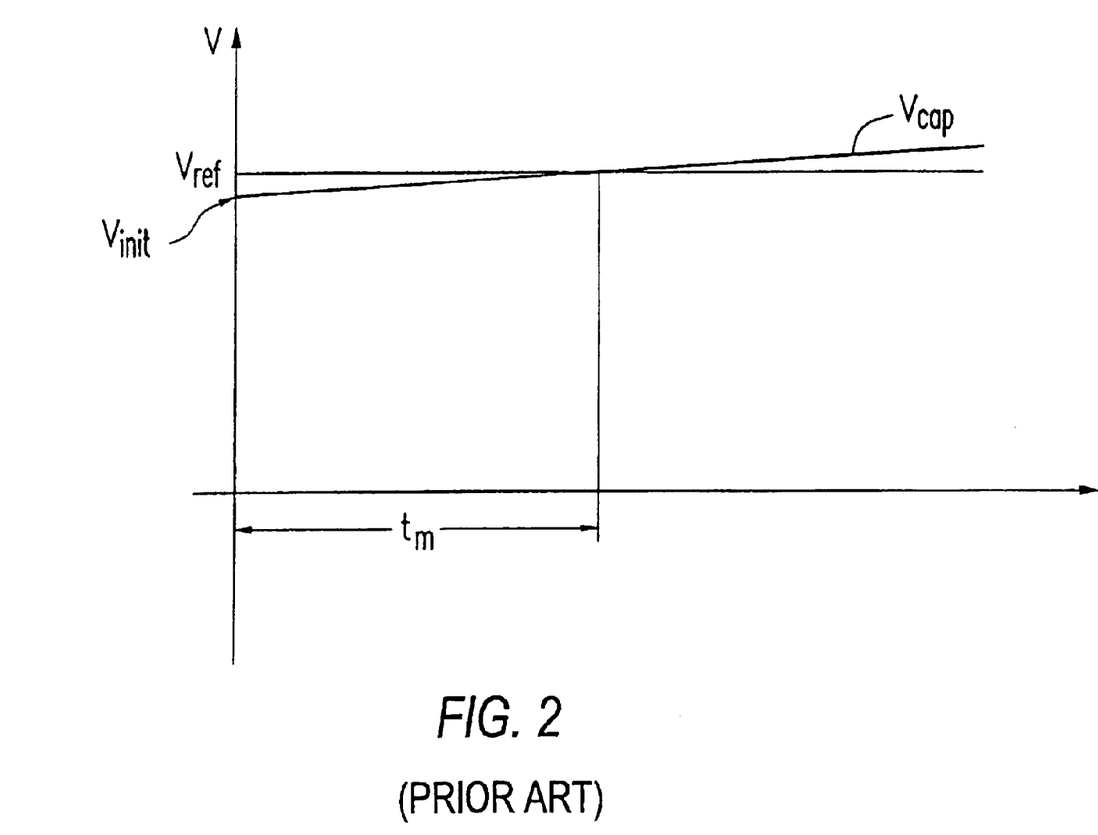
FIG. 2 shows an idealized time versus voltage plot of an integrated voltage according to one method of sensing MRAM cell resistance.

FIG. 2 shows the theoretical change of voltage on such a capacitor with time. The time interval $t_m$ that the capacitor voltage $V_{cap}$ takes to rise from an initial voltage $V_{init}$ to a reference voltage $V_{ref}$ is related to the voltage applied at the input of the transductance amplifier.

A conventional sensing technique compares $V_{cap}$ with $V_{ref}$, allowing $V_{cap}$ to increase until $V_{cap}$ exceeds $V_{ref}$ and then discharging a capacitor until $V_{cap}$ is again below $V_{ref}$. Pulses indicating a comparison result can be counted to measure the sensing voltage, which, in turn, indicates an element's resistance state. Problems arise, however, when large counts accumulate during a sampling period.

BRIEF SUMMARY OF THE INVENTION

The present invention provides techniques in which currents supplied to a capacitor during and discharging intervals are set to affect counts.

According to an exemplary embodiment of the present invention, an MRAM cell logic state is sensed by configuring a memory cell so as to form a sensing voltage across the cell that is related to a resistance of the cell. The sensing voltage is applied to an input of a transconductance amplifier, which outputs a sensing current related to the sensing voltage. The sensing current is integrated over time to measure the sensing voltage.

During integration, the sensing current is summed alternately with either a positive or a negative current. The positive current summed with the amplified sensing current charges the capacitor until it exceeds a reference voltage, and then the negative current summed with the amplified sensed current discharges the capacitor until it is again below the reference voltage. Pulses are provided periodically to a digital counter, with an UP count pulse provided when the capacitor exceeds the reference voltage, and a DOWN count pulse provided when the reference voltage exceeds that on the capacitor. By comparing the count value of the digital counter to a threshold value at a known time interval after initializing the counter, the logical state of the sensed MRAM cell can be ascertained. If the magnitude of positive current is maintained below the negative current, that is, $I_{up} < I_{down}$, then the range of the counter is improved by reducing the count over each sampling period.

These and other features and advantages of the invention will be more clearly understood from the following detailed description, which is provided in connection with the accompanying drawings.

DETAILED DESCRIPTION OF THE INVENTION

In an exemplary embodiment of the present invention a signal representing a programmed resistance state of a resistive memory cell is received at an amplifier coupled to a capacitor. The capacitor is further coupled to a comparator coupled to a reference voltage source and controlled by a clock. The output of the comparator is coupled to a pair of switches. A first switch connects a positive current source to the capacitor and a second switch connects a negative current source to the capacitor. The comparator output could alternatively be connected to a single switch that connects to both positive and negative current sources and is switchable between the positive and negative current sources. The positive current integrated with the sensing current from the amplifier charges the capacitor and the negative current integrated with the sensing current discharges the capacitor. The outputs of the comparator are further coupled to an UP/DOWN counter also controlled by a clock. The current source circuit includes the positive current source, the negative current source and the switches. The amount of positive current is kept below the amount of negative current, that is, $I_{up} < I_{down}$. The UP/DOWN counter contains a digital value acquired over a sampling period for the memory cell.

Figure 3:
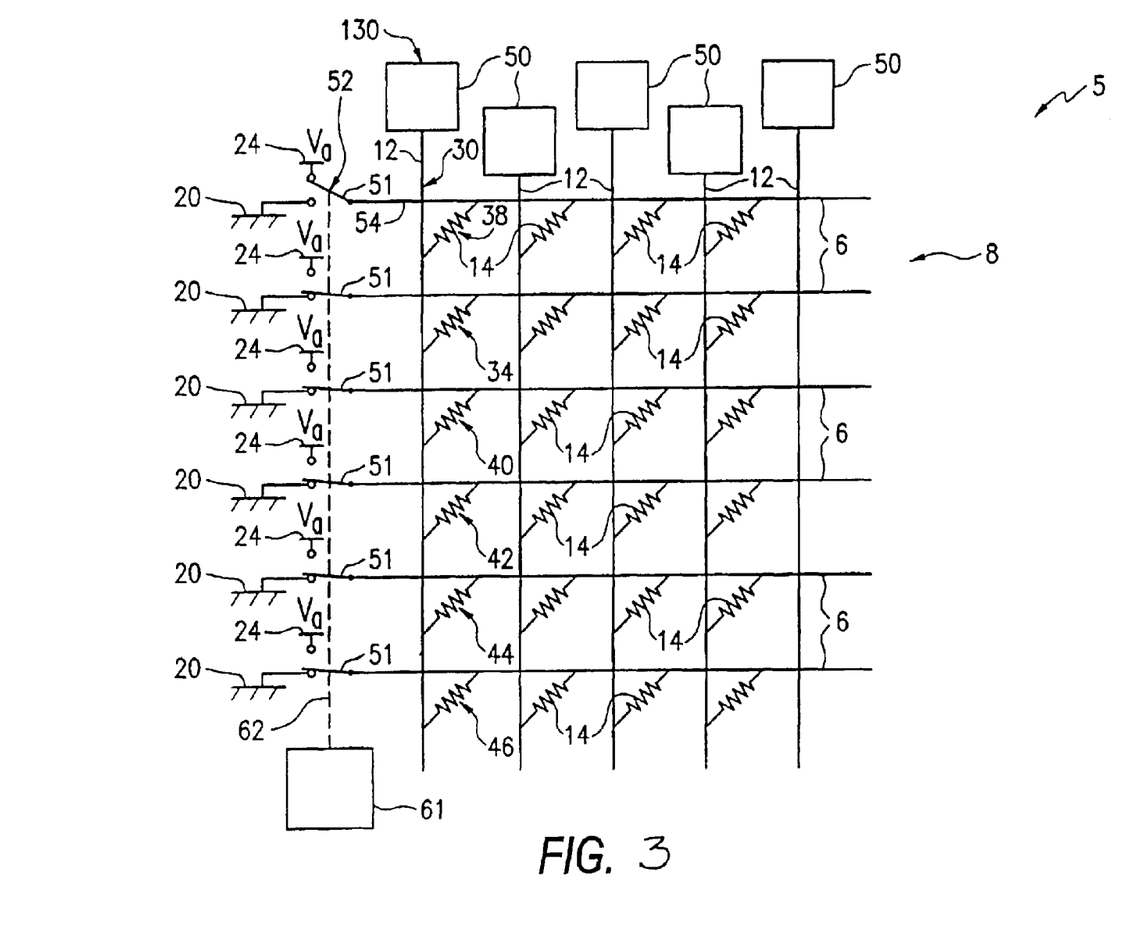
FIG. 3 shows a portion of a magnetic random access memory device.

FIG. 3 shows, in schematic overview, a portion of a memory device 5 according to an exemplary embodiment of the invention. The circuitry shown in FIG. 3 may all be integrated on one substrate. A crosspoint array of resistive memory cells is configured so that resistance of a particular memory cell may be represented by a sensing voltage. The device 5 includes an array 8 of MRAM cells 14, a plurality of spaced electrically conductive row lines 6, and a plurality of spaced electrically conductive column lines 12. The plurality of row lines 6 is disposed substantially orthogonally to the plurality of column lines 12, defining a plurality of overlap regions at the respective crossings. In other embodiments, the row and column lines can be disposed in oblique spaced relation to one another. Each row line is connected to each column line by a respective MRAM resistive cell 14. A plurality of switching devices 51, typically implemented with transistors, is each coupled to a respective one of the row lines 6, to a first source of constant potential (ground) 20, and a second source of constant potential (array voltage $V_a$) 24. A control circuit 61 includes a row decoder, and is coupled, as illustrated by dashed line 62, to each of switching devices 51. The switching devices 51 are adapted to alternately connect the row lines 6 to ground 20 and to voltage source, $V_a$ 24 under the control of control circuit 61. The control circuit 61 maintains each of switching devices 51 in a default row line grounded condition. Switching device 52 illustrates the state of switching device 51 when row 54 is selected during a read cycle. A plurality of sensing circuits 50 are respectively connected to column lines 12.

A power supply (not shown) provides a source of electrical voltage that maintains the various electrical potentials at which the circuit operates. The power supply defines three potentials including a ground potential 20, an operating voltage $V_{cc}$ for the circuit elements, and the voltage $V_a$ 24 connected as indicated above. In one implementation, the voltage $V_a$ 24 is approximately 5 volts.

Figure 4:
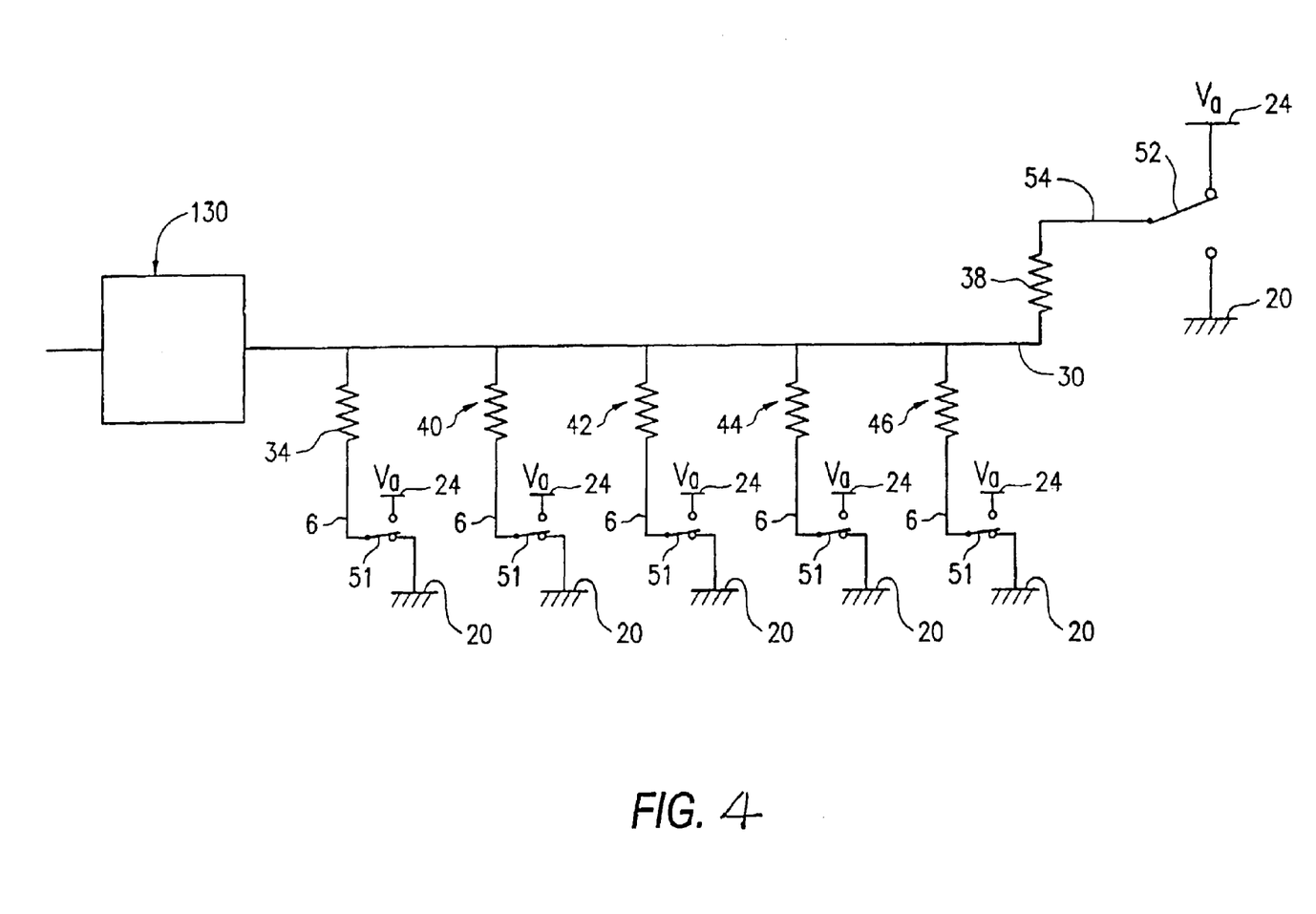
FIG. 4 shows a portion of the FIG. 3 device during cell sensing.

In FIG. 4, selected row line 54 is shown coupled to the voltage $V_a$ 24 by selected switching device 52. A particular addressed column line 30 of the plurality of column lines 12 is also shown. The first end of the sensed memory cell 38 that connects the selected row line 54 and the particular column line 30 is also illustrated. A respective sensing circuit 130 is operatively connected to column line 30 for sensing the voltage of the column line 30 with respect to ground 20.

As illustrated, sneak path memory cells, e.g., 34, 40, 42, 44, 46, forming a subset of the plurality of memory cells 14, are connected between the column line 30 and a respective plurality of row lines 6. Each row line 6, except for the one connected to sensed cell 38, is grounded by a respective switching device 51. Thus a voltage divider is formed by the parallel combination of sneak path cells, e.g., 34, 40, 42, 44, 46 connected in series with the particular resistance cell 38 being sensed. Column line 30 defines a sensing node between the sneak path cells and the sensed cell 38. The sensing voltage at column line 30 is coupled to the sensing circuit 130.

In one embodiment, the resistance of selected resistive memory cell 38 ranges from about 900KΩ to about 1.1MΩ. In various embodiments prepared using current technology, memory cell resistance may be found in a range from about 900KΩ to about 1MΩ in the low resistance state and from about 950KΩ to about 1.1MΩ in the high resistance state. In a particular device, the low and high ranges do not overlap. It is understood that advances in the technology of the resistive cell may yield different resistance values to which the present invention may nonetheless be effectively applied.

A noise shaping based sensing amplifier used in a MRAM to sense the voltage and thus the logic state of a memory cell results in an inherent offset. For example, in the low resistance state, the input voltage to the sense amplifier may be 1.992 mV and in the high resistance state, the input voltage may be 2.212 mV. The actual signal to be sensed is the difference between these two voltages or about 220 μV. Sensing circuit 130 reduces or eliminates the offset from the data (input voltages), that is, the roughly 2 mV common to both input voltages.

Because the output of the sense amplifier is a series of UPs and DOWNs to a counter, reduction or elimination of the offset can reduce the size of the counter used to count the number of UPs and DOWNs. In general the counter must be large enough to count the maximum and minimum values that can occur in a sampling period. For example, the UP counts correspond to increasing the value in the counter by one (+1) and DOWN counts correspond to decreasing the value in the counter by one (−1). The sequence 1 1 1 −1 1 −1 then corresponds to an average of (4−2)/6 or ⅓. Reducing the offset has the effect of reducing the maximum value that occurs in a sampling period, which is three in this example because of the initial string of three 1's.

At the end of the sampling period, the count value indicates the proportion of the sampling period during which $V_{cap}$ exceeded $V_{ref}$, and this, in turn, is a measure of $V_{in}$. The count value need not, however, be equal to the indicated proportion; for example, the offset can be reduced so that a count of zero indicates the proportion when at high resistance and a higher non-zero count indicates the proportion when at low resistance.

Compensation for the offset can be accomplished by adjusting bias currents used in the sense amplifier. A positive bias current provided while the capacitor is charged can be set below a negative bias current provided during discharge. For a typical sense amplifier to function properly, the average of the positive and negative bias currents must equal the input current. That is, $g_{in}V_{in}$=average of $I_{up}$ and $I_{down}$.

Figure 5A:
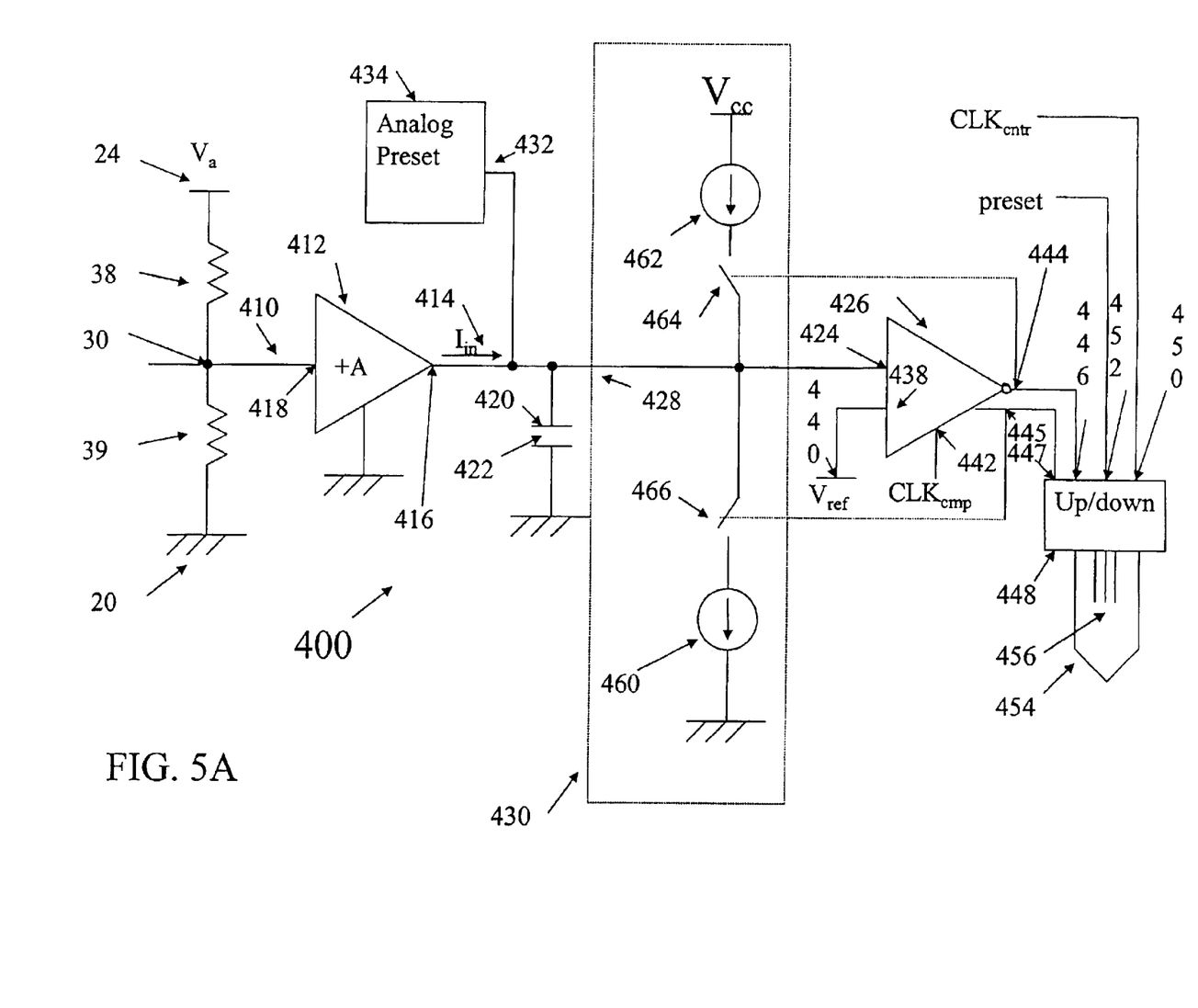
FIG. 5A shows a sensing circuit of the present invention in block diagram form.

FIG. 5A is an embodiment of the present invention in which a sensing circuit 400 has an input 410 connected to a column line 30 of a resistive memory device. An end of sensed resistive memory cell 38 is connected to column line 30. Column line 30 is also connected to the sneak path represented by resistance 39. The sensing circuit 400 includes a transconductance amplifier 412. The transconductance amplifier has a transfer function $g_{in}$ such that a current 414 output at an output node 416 of the amplifier is proportional to a voltage $V_{in}$ applied at an input node 418 of the amplifier, i.e., $I_{in}=g_{in}V_{in}$. The output node 416 of the amplifier is connected to a first plate 420 of a capacitor 422, to a first input 424 of a clocked comparator 426, to bias node 428 of current source circuit 430, and (optionally) to an output 432 of an analog preset circuit 434. It should be noted that the function of the analog preset circuit may be performed by a properly configured transconductance amplifier 412 making a separate analog preset circuit unnecessary.

Comparator 426 has two outputs, where output 444 is shown with an inverter to indicate that it is the negative (opposite logical state) of output 445. Alternatively, output 445 could be inverted to obtain output 444. The current source 430 is adapted to alternately supply or withdraw a current from the first capacitor plate 420 according to the state of a pair of switches 464, 466, which are open or closed depending upon a feedback to each switch from the comparator 426. Both switches cannot be closed concurrently. The clocked comparator further includes a second input 438 adapted to be maintained at a reference voltage $V_{ref}$ by a reference voltage source 440 and a clock input 442 adapted to receive a clock signal $CLK_{cmp}$. The outputs 444, 445 of comparator 426 are coupled to switches 464, 466, which could be transistors that control connection of $I_{up}$ (positive) and $I_{down}$ (negative) current of the current source circuit 430 to first capacitor plate 420. Switch 464 is coupled to output 444 of comparator 426 and switch 466 is coupled to output 445 of comparator 426. Outputs 444, 445 of the comparator are further coupled to UP/DOWN inputs 446, 447 respectively of a clocked counter 448. The clocked counter includes a clock input 450, a preset input 452 and a digital count output 454 including a plurality of digital output lines 456.

In operation, a preset voltage is established across capacitor 422 by the analog preset circuit 434. A digital preset value is established at the output 454 of counter 448 by a signal transition applied at the digital preset input 452.

Assuming that the preset voltage on the capacitor 422 is less than the reference voltage $V_{ref}$ applied at the second input 438 of the comparator 426, the inverted output 444 of the comparator 426 will apply a corresponding UP input at the input 446 of the digital counter 448 as soon as the clock input 442 of the comparator 426 receives a clock signal transition. The outputs 444, 445 of the comparator are also applied to both switches 464, 466 respectively of the current supply circuit 430. Accordingly, while $V_{cap}<V_{ref}$ switch 464 is closed and switch 466 is open and the charging current to capacitor 422 is $I_{in}+I_{up}$. Then, when $V_{cap}>V_{ref}$, outputs 444 and 445 open switch 464 and close switch 466 respectively so that the discharge current from capacitor 422 is $I_{in}-I_{down}$.

The voltage on the capacitor 422 rises above the voltage threshold defined by the reference voltage $V_{ref}$ applied at input 438 of comparator 426. Thereafter, the voltage on capacitor 422 continues to rise until a clock transition is detected at clock input 442 of comparator 426. Upon detection of a clock transition, the logical state of the outputs 444 and 445 of comparator 426 toggle (e.g., from "0" to "1" after inversion of output 444 and from "1" to "0" at output 445) and apply a corresponding UP input at the input 446 of the digital counter 448. Responsively, the current supply circuit 430 changes state to withdraw current from capacitor 422. As current is withdrawn from capacitor 422, the voltage on the capacitor falls to, and then below the reference voltage $V_{ref}$ level. Thereafter, when the clock signal at input 442 of comparator 426 transitions, the comparator output toggles again, but this time a DOWN signal is provided to input 447.

Counter 448 cyclically counts away from its preset value and back toward it. Consequently, the counter counts UP and DOWN during alternate charging and discharging intervals and the time average value of the digital counter or the value at the end of the sampling period should approximate one of two values—a high value for a low resistance and a low value for a high resistance.

As noted above, current 414 from the amplifier 412 adds with the currents 460, 462 from the current supply circuit 430 in accordance with the switches 464, 466 being open or closed. Without the bias current supplied by the current supply circuit 430, the sense of the current 414 out of the amplifier 412 tends to charge capacitor 422 so that capacitor 422 charges more quickly than it discharges. Consequently, more rising transitions of the comparator clock signal occur while the voltage on capacitor 422 exceeds $V_{ref}$ than while it is less than $V_{ref}$. In some instances, the voltage on capacitor 422 will rise to the point where the discharge that occurs during one clock interval is insufficient to bring the voltage of the capacitor 422 below the reference voltage. Consequently, the voltage on the capacitor is above the reference voltage for multiple consecutive rising transitions of the clock.

Current source circuit 430 has two current sources 460, 462 which are manufactured so that certain currents are provided. Current sources 460, 462 can, for example, be switches that are always on, providing fixed currents. That is, current sources 460, 462 can be implemented as circuits that include one or more transistors that are always on such as followers. Alternatively, circuits could be used in which it is possible to control the current by changing the voltage on a transistor's gate.

Using current source circuit 430 in which the magnitude of $I_{up}$ (positive) current is below the magnitude of $I_{down}$ (negative) current reduces the average of the number of UPs and DOWNs input to the counter per sampling period and thus the size (number of bits required) of the counter can be reduced. This gives the counter a better overall range.

By adjusting the magnitudes of $I_{up}$ (positive) and $I_{down}$ (negative) current, the center point of both the sense amplifier and the counter can be moved. When adjusted optimally, the counter output will end up approximating zero. That is, $I_{up}+g_{in}V_{in}\approx I_{down}$ results in a centering of the counter so that the up/down counts for different resistance values all have smaller maximum and minimum values and, therefore, the counter can be made smaller.

Figure 5B:
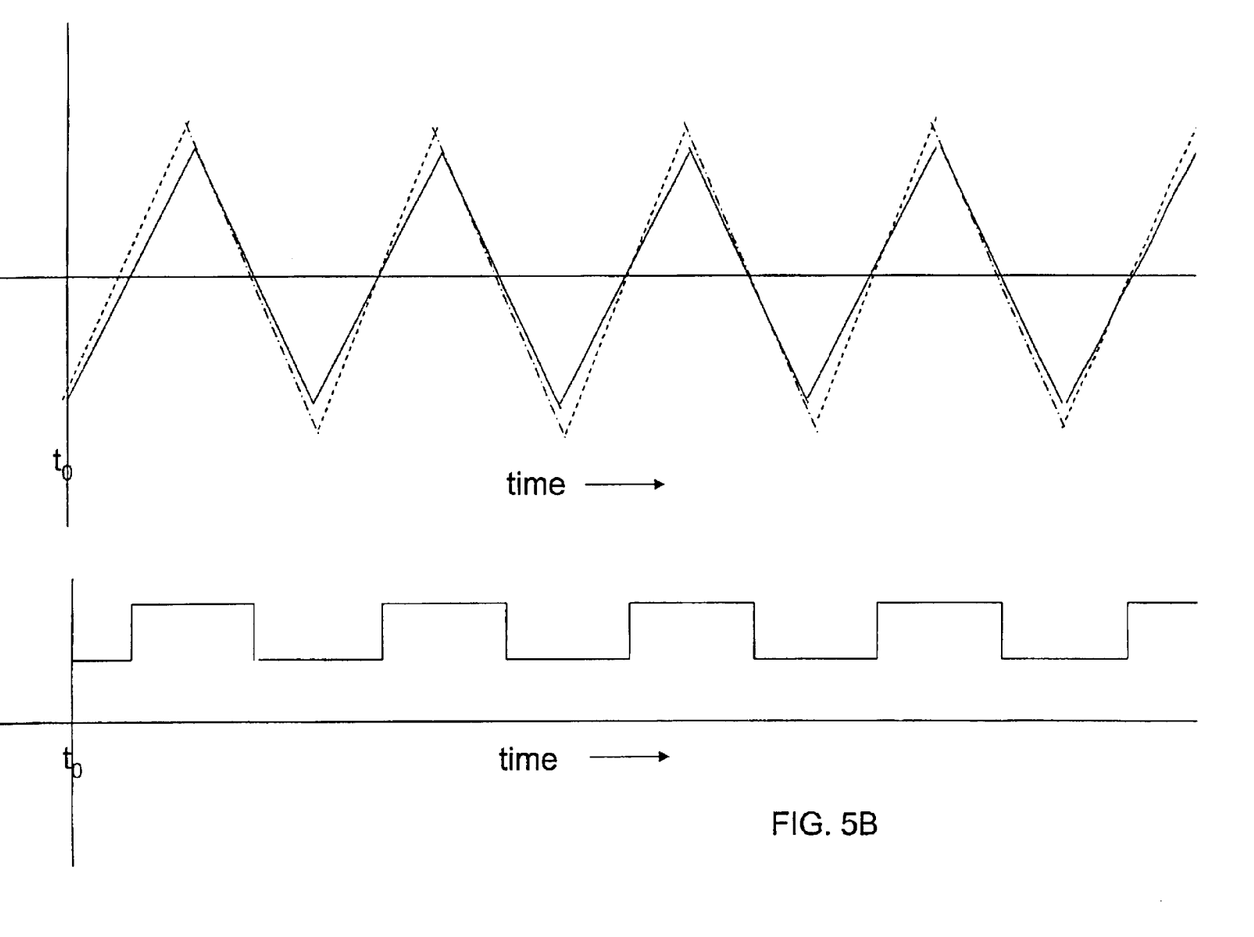
FIG. 5B is a set of timing diagrams for the sensing circuit in FIG. 5A.

FIG. 5B shows diagrams over time of the behavior of various signals in sensing circuit 400. In both diagrams, time is along the horizontal axis. In the upper diagram, the solid line shows the signal on the capacitor when no additional bias current is applied. There is a tendency for the positive current applied by $I_{up}$ 462 via switch 464 (depicted as a dotted line in the upper diagram) to increase the charge on the capacitor over time to such an extent that the capacitor will not be able to discharge below the threshold in a single clock cycle, leading to a count greater than zero. A greater amount of negative current can, however, be applied by $I_{down}$ 460 via switch 466 (as depicted by the dashed and dotted line) than positive current. This results in a counter that approximates zero. The output of the counter (as depicted in the bottom diagram) begins at to at a preset value such as zero and alternates so that the count is substantially constant. For each increase in the count (+1) or UP count, there is a corresponding decrease (−1) or DOWN count. A smaller counter can be used because the maximum count is +1.

For example, using an equal amount of $I_{up}$ and $I_{down}$ the counter output for a logical zero (0) or high resistance might be 156 and the counter output for a logical one (1) or low resistance might be 180. Using unequal amounts of $I_{up}$ and $I_{down}$ the counter output for a logical zero (0) might be 0 and the counter output for a logical one (1) might be 24. A significantly smaller counter is required—a six bit counter may suffice where a nine bit counter might otherwise be necessary.

Figure 6:
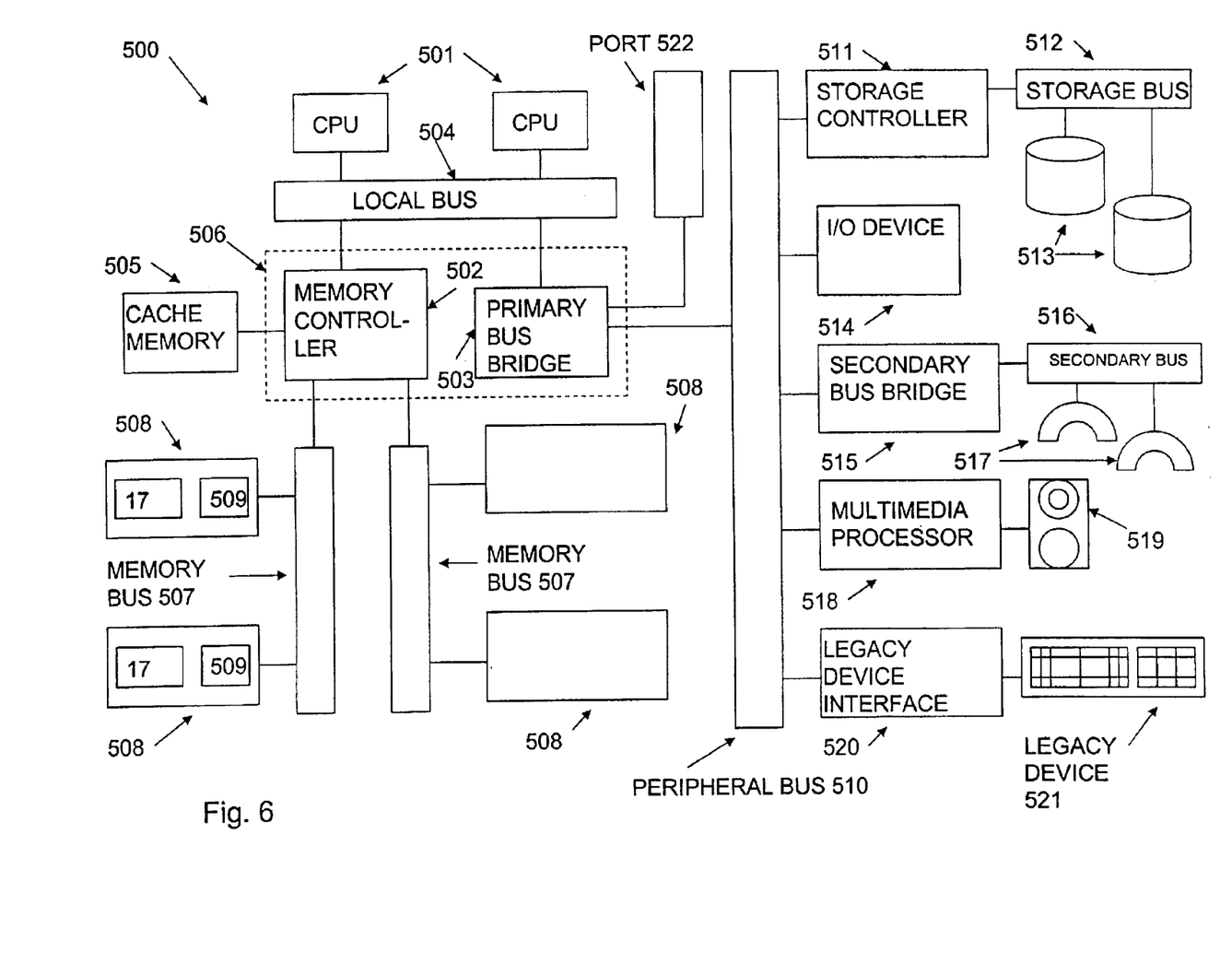
FIG. 6 shows a digital processing system incorporating a memory device having a sensing circuit according to an exemplary embodiment of the present invention.

FIG. 6 illustrates an exemplary digital processing system 500 which utilizes a memory device 17 employing the sensing circuit 400 of the present invention disclosed above in connection with FIGS. 5A–5B. The processing system 500 includes one or more processors 501 coupled to a local bus 504. A memory controller 502 and a primary bus bridge 503 are also coupled the local bus 504. The processing system 500 may include multiple memory controllers 502 and/or multiple primary bus bridges 503. The memory controller 502 and the primary bus bridge 503 may be integrated as a single device 506.

The memory controller 502 is also coupled to one or more memory buses 507. Each memory bus accepts memory components 508, which include at least one memory device 17 that includes sensing circuit 400. Each of the memory components 508 may be a memory card or a memory module. Examples of memory modules include single inline memory modules (SIMMs) and dual inline memory modules (DIMMs). The memory components 508 may include one or more additional devices 509. For example, in a SIMM or DIMM, the additional device 509 might be a configuration memory, such as a serial presence detect (SPD) memory. The memory controller 502 may also be coupled to a cache memory 505. The cache memory 505 may be the only cache memory in the processing system. Alternatively, other devices, for example, processors 501 may also include cache memories, which may form a cache hierarchy with cache memory 505. If the processing system 500 include peripherals or controllers which are bus masters or which support direct memory access (DMA), the memory controller 502 may implement a cache coherency protocol. If the memory controller 502 is coupled to a plurality of memory buses 507, each memory bus 507 may be operated in parallel, or different address ranges may be mapped to different memory buses 507.

The primary bus bridge 503 is coupled to at least one peripheral bus 510. Various devices, such as peripherals or additional bus bridges may be coupled to the peripheral bus 510. These devices may include a storage controller 511, a miscellaneous I/O device 514, a secondary bus bridge 515, a multimedia processor 518, and a legacy device interface 520. The primary bus bridge 503 may also coupled to one or more special purpose high speed ports 522. In a personal computer, for example, the special purpose port might be the Accelerated Graphics Port (AGP), used to couple a high performance video card to the processing system 500.

The storage controller 511 couples one or more storage devices 513, via a storage bus 512, to the peripheral bus 510. For example, the storage controller 511 may be a SCSI controller and storage devices 513 may be SCSI discs. The I/O device 514 may be any sort of peripheral. For example, the I/O device 514 may be a local area network interface, such as an Ethernet card. The secondary bus bridge may be used to interface additional devices via another bus to the processing system. For example, the secondary bus bridge may be an universal serial port (USB) controller used to couple USB devices 517 via to the processing system 500. The multimedia processor 518 may be a sound card, a video capture card, or any other type of media interface, which may also be coupled to one additional devices such as speakers 519. The legacy device interface 520 is used to couple legacy devices, for example, older styled keyboards and mice, to the processing system 500.

The processing system 500 illustrated in FIG. 6 is only an exemplary processing system with which the invention may be used. While FIG. 6 illustrates a processing architecture especially suitable for a general purpose computer, such as a personal computer or a workstation, it should be recognized that well known modifications can be made to configure the processing system 500 to become more suitable for use in a variety of applications. For example, many electronic devices which require processing may be implemented using a simpler architecture which relies on a CPU 501 coupled to memory components 508 and/or memory devices 100. These electronic devices may include, but are not limited to audio/video processors and recorders, gaming consoles, digital television sets, wired or wireless telephones, navigation devices (including systems based on the global positioning system (GPS) and/or inertial navigation), and digital cameras and/or recorders. The modifications may include, for example, elimination of unnecessary components, addition of specialized devices or circuits, and/or integration of a plurality of devices.

While embodiments of the invention have been described in the illustrations above, it should be understood that these are exemplary of the invention and are not to be considered as limiting. While the present invention has been described in terms of MRAM, it is not limited thereto but is applicable to, for example, PCRAM and other circuits in which signals are sensed at different levels. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A sensing circuit, comprising:
    an amplifier comprising an amplifier input for receiving a signal from a resistive memory cell and an amplifier output;
    a capacitor comprising a first plate coupled to said amplifier output and a second plate;
    a current source circuit comprising a control node and a current node supplying a current at said first plate of said capacitor; and a comparator comprising a first comparator input coupled to said capacitor, a second comparator input, and a comparator output, coupled to said control node of said current source; and a counter, coupled to said comparator output.

2. The sensing circuit of claim 1, wherein said amplifier is a transconductance amplifier.

3. The sensing circuit of claim 1, wherein said second plate is coupled to a predetermined voltage.

4. The sensing circuit of claim 3, wherein said predetermined voltage is a ground potential.

5. The sensing circuit of claim 1, further comprising:
a bias circuit for producing a first predetermined voltage, said bias circuit coupled to said first plate of said capacitor.

6. The sensing circuit of claim 1, wherein said current at said current node is configurable based on a state of a signal produced by said comparator output.

7. The sensing circuit of claim 1, wherein said comparator includes a first clock input node for receiving a first clock signal.

8. The sensing circuit of claim 7, wherein said counter includes a second clock input node for receiving a second clock signal different from said first clock signal.

9. The sensing circuit of claim 1, wherein said current source circuit further comprises:
a first current source coupled to a first predetermined voltage source;
a first switch, coupled to said first current source and said current output node;
a second switch, coupled to said current output node;
a second current source, coupled to said second switch and a second predetermined voltage source; and
a control circuit, coupled to said control node and said first and second switches, for configuring states of said first and second switches based on a state of said control node.

10. The sensing circuit of claim 1, wherein said first current source comprises a first source follower transistor and said second current source comprises a second source follower transistor.

11. An integrated circuit, comprising:
a substrate;
circuitry formed at a surface of said substrate, said circuitry comprising:
an array of resistive memory elements;
a sensing line extending across said array, connected to a set of resistive memory elements in the array; and
sensing circuitry, comprising:
an amplifier comprising an amplifier input for receiving a signal from one of said resistive memory elements in said set and an amplifier output;
a capacitor comprising a first plate coupled to said amplifier output and a second plate;
a current source circuit comprising a control node and a current node supplying a current at said first plate of said capacitor; and
a comparator comprising a first comparator input coupled to said capacitor, a second comparator input, and a comparator output, coupled to said control node of said current source; and
a counter, coupled to said comparator output.

12. The integrated circuit of claim 11, wherein said amplifier is a transconductance amplifier.

13. The integrated circuit of claim 11, wherein said second plate is coupled to a predetermined voltage.

14. The integrated circuit of claim 13, wherein said predetermined voltage is a ground potential.

15. The integrated circuit of claim 11, further comprising:
a bias circuit for producing a first predetermined voltage, said bias circuit coupled to said first plate of said capacitor.

16. The integrated circuit of claim 11, wherein said current at said current node is configurable based on a state of a signal produced by said comparator output.

17. The integrated circuit of claim 11, wherein said comparator includes a first clock input node for receiving a first clock signal.

18. The integrated circuit of claim 17, wherein said counter includes a second clock input node for receiving a second clock signal different from said first clock signal.

19. The integrated circuit of claim 11, wherein said current source circuit further comprises:
a first current source coupled to a first predetermined voltage source;
a first switch, coupled to said first current source and said current output node;
a second switch, coupled to said current output node;
a second current source, coupled to said second switch and a second predetermined voltage source; and
a control circuit, coupled to said control node and said first and second switches, for configuring states of said first and second switches based on a state of said control node.

20. The integrated circuit of claim 11, wherein said first current source comprises a first source follower transistor and said second current source comprises a second source follower transistor.

21. A digital processing system, comprising:
a processor; and
a resistive memory device coupled to said processor via a bus, said resistive memory device comprising a sensing circuit for sensing a resistive state of a resistive memory cell in said resistive memory device, said sensing circuit comprising:
an amplifier comprising an amplifier input for receiving a signal from one of said resistive memory elements and an amplifier output;
a capacitor comprising a first plate coupled to said amplifier output and a second plate;
a current source circuit comprising a control node and a current node supplying a current at said first plate of said capacitor; and
a comparator comprising a first comparator input coupled to said capacitor, a second comparator input, and a comparator output, coupled to said control node of said current source; and
a counter, coupled to said comparator output.

22. The digital processing system of claim 21, wherein said amplifier is a transconductance amplifier.

23. The digital processing system of claim 21, wherein said second plate is coupled to a predetermined voltage.

24. The digital processing system of claim 23, wherein said predetermined voltage is a ground potential.

25. The digital processing system of claim 21, further comprising:
a bias circuit for producing a first predetermined voltage, said bias circuit coupled to said first plate of said capacitor.

26. The digital processing system of claim 21, wherein said current at said current node is configurable based on a state of a signal produced by said comparator output.

27. The digital processing system of claim 21, wherein said comparator includes a first clock input node for receiving a first clock signal.

28. The digital processing system of claim 27, wherein said counter includes a second clock input node for receiving a second clock signal different from said first clock signal.

29. The digital processing system of claim 21, wherein said current source circuit further comprises:

- a first current source coupled to a first predetermined voltage source;
- a first switch, coupled to said first current source and said current output node;
- a second switch, coupled to said current output node;
- a second current source, coupled to said second switch and a second predetermined voltage source; and
- a control circuit, coupled to said control node and said first and second switches, for configuring states of said first and second switches based on a state of said control node.

30. The digital processing system of claim 21, wherein said first current source comprises a first source follower transistor and said second current source comprises a second source follower transistor.

* * * * *

UNITED STATES PATENT AND TRADEMARK OFFICE
CERTIFICATE OF CORRECTION

PATENT NO. : 6,930,942 B2 Page 1 of 1
DATED : August 16, 2005
INVENTOR(S) : R. J. Baker It is certified that error appears in the above-identified patent and that said Letters Patent is hereby corrected as shown below:

<u>Column 1,</u>
Line 52, "impose" should read -- imposes --;

<u>Column 2,</u>
Line 29, "during and discharging" should read -- during charging and discharging --;

<u>Column 7,</u>
Line 15, "to" should read -- $t_o$ --;
Line 57, "500 include" should read -- 500 includes --;

<u>Column 8,</u>
Line 4, "also coupled" should read -- also be coupled --;
Line 17, "an universal" should read -- a universal --; and
Line 21, "to one additional" should read -- to additional --.

Signed and Sealed this

Sixth Day of June, 2006

JON W. DUDAS
*Director of the United States Patent and Trademark Office*